(12) United States Patent
Erdogan et al.

(10) Patent No.: US 7,474,160 B2
(45) Date of Patent: Jan. 6, 2009

(54) SYSTEMS AND METHODS FOR CALIBRATING A FILTER

(75) Inventors: Ozan E. Erdogan, Campbell, CA (US); Jacques C. Rudell, Redwood City, CA (US); Roger Brockenbrough, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/439,732

(22) Filed: May 23, 2006

(65) Prior Publication Data

US 2006/0267698 A1 Nov. 30, 2006

Related U.S. Application Data

(60) Provisional application No. 60/714,533, filed on May 25, 2005.

(51) Int. Cl.
G01R 23/00 (2006.01)
H03B 5/24 (2006.01)
H03K 3/03 (2006.01)

(52) U.S. Cl. .............................. 331/59; 331/44; 331/57
(58) Field of Classification Search .................. 364/724; 331/17, 44, 52, 57, 59
See application file for complete search history.

(56) References Cited

U.S. PATENT DOCUMENTS 5,748,513 A * 5/1998 Van Duyne .................. 708/320

2006/0154636 A1 * 7/2006 Shah et al. .................. 455/290

OTHER PUBLICATIONS

C. Frost, G. Levy, B. Allison, A Self-Calibrating Bandpass Filter and Trnceiver System tuning and Test Technique, May 2003☐☐Instrumentation and Measurement Technology Conference, May 20-22, 2003.*
The Electrical Engineering Handbook, CRC Press LLC, © 2000, Chapter 1, Section 1.2.*
Chongxin Lui, Jian Li, Lin Li, "New current-version negative-feedback biquad filter using op amp", Circuits and Systems, (c) 2000, IEEE APCCAS 2000, The 2000 IEEE Asia-Pacific Conference, pp. 723-726.*
J.C. Rudell et al. A 5th-Order Continuous-Time Harmonic-Rejection GmC Filter with In-Situ Calibration for Use in Transmitter Applications. IEEE International Solid-State Circuits Conference, Feb. 8, 2005, pp. 322-324, San Francisco, US, XP002400175.
John M. Khoury, "Design of a 15-MHz CMOS Continuous-Time Filter with On-Chip Tuning", IEEE Journal of Solid-State Circuits, Dec. 1991, pp. 1988-1997, vol. 26, No. 12, IEEE, Piscataway, NJ, USA.

(Continued)

*Primary Examiner*—David Mis
(74) *Attorney, Agent, or Firm*—Alex C. Chen; Ramin Mobarhan; Thomas R. Rouse

(57) ABSTRACT

Calibrating a filter is disclosed. The filter is reconfigured as an oscillator during calibration. Switches and/or other implementations of reconfiguring a filter are used to reconfigure the negative feedback loop of the filter to a positive feedback loop. The oscillation parameters are then measured to adjust the components of the filter to achieve an oscillation that corresponds to a desired filter characteristic.

61 Claims, 6 Drawing Sheets

OTHER PUBLICATIONS

P.F. Santos et al., "Design and Tuning Techniques for a 100 MHz CMOS Continuous-Time Narrow-Bandwidth Bandpass Filter", Apr. 1996, pp. 917-920, 0-7803-2972-4/96, IEEE, Piscataway, NJ, USA.

Geert A. de Veirman et al., "Design of a Bipolar 10-MHz Programmable Continuous-Time 0.05° Equiripple Linear Phase Filter", IEEE Journal of Solid-State Circuits, Mar. 1992, pp. 324-331, vol. 27, No. 3, IEEE, Piscataway, NJ, USA.

C. Cavalcanti et al., "A CMOS/SOI Continuous-Time Low-Pass Gm-C Filter", XV SBMicro Intl. Conference on Microelectronics & Packaging. Sep. 2000, pp. 1-6, Manaus, Brazil.

Osama Shan'a et al., "Low-Voltage High-Speed Current-Mode Continuous-Time IC Filters with Orthogonal wo-Q Tuning", IEEE Transactions on Circuits and Systems-13 II: Analog and Digital Signal Processing, Apr. 1999, pp. 390-400, vol. 46, No. 4, IEEE, Piscataway, NJ, USA.

Haideh Khorramabadi et al., Baseband Filters for IS-95 CDMA Reciever Applications Featuring Digital Automatic Frequency Tuning, ISSCC Slide Supplement, 1996, pp. 134-135; 392, Session 10, IEEE, Piscataway, NJ, USA.

Taner Sümesağlam et al., "A Digital Approach for Automatic Tuning of Continuous-Time High-Q Filters", IEEE Transactions on Circuits and Systems—II: Analog and Digital Signal Processing, Oct. 2003, pp. 755-761, vol. 50, No. 10, IEEE, Piscataway, NJ, USA.

* cited by examiner

SYSTEMS AND METHODS FOR CALIBRATING A FILTER

RELATED APPLICATIONS

This application claims the benefit of provisional U.S. application Ser. No. 60/714,533, entitled "FILTER CALIBRATION," filed May 25, 2005.

BACKGROUND

The effects of process variations, operation temperature variability, aging, and other environmental variables contribute to performance characteristics deviance from the designed specifications of existing filters used in communication devices. Absolute values of on-chip RC time constants may vary by as much as one hundred percent due to these effects. To account for these variabilities, a number of methods have been proposed to allow on-chip calibration of filters. Current methods include both direct and secondary methods. Direct methods include measuring performance characteristics of actual filter components to calibrate the filter. Secondary methods include measuring performance characteristics of components on a separate on-chip test circuitry not attached to the filter. Commonly in secondary methods, test circuit component measurements are assumed to be consistent throughout the chip and used to tune all of the components on the chip, including the components of the filter. In actuality however, characteristic values can vary significantly on different areas of the same chip, thus potentially leading to an inaccurate filter component value approximation. Actual filter characteristics of the filter can also be measured with direct methods. Test signals generated on the chip are sent through the filter to be measured and analyzed. These measurements are then used to tune filter components. Although this method results in an accurate filter calibration, signal generation and analysis mechanisms can be complex and costly to implement. Therefore, it is desirable to develop a cost effective and simple, yet accurate way of calibrating filters.

BRIEF DESCRIPTION OF THE DRAWINGS

Various embodiments of the disclosure are disclosed in the following detailed description and the accompanying drawings.

DETAILED DESCRIPTION

The disclosure can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the disclosure may take, may be referred to as techniques. In general, the order of the steps of disclosed processes may be altered within the scope of the disclosure.

A detailed description of one or more embodiments of the disclosure is provided below along with accompanying figures that illustrate the principles of the disclosure. The disclosure is described in connection with such embodiments, but the disclosure is not limited to any embodiment. The scope of the disclosure is limited only by the claims and the disclosure encompasses numerous alternatives, modifications and equivalents. Numerous specific details are set forth in the following description in order to provide a thorough understanding of the disclosure. These details are provided for the purpose of example and the disclosure may be practiced according to the claims without some or all of these specific details. For the purpose of clarity, technical material that is known in the technical fields related to the disclosure has not been described in detail so that the disclosure is not unnecessarily obscured.

Filter calibration is disclosed. In some embodiments, the filter is reconfigured as an oscillator during calibration mode. Switches and/or other implementations of reconfiguring a filter are used to reconfigure the negative feedback loop of the filter to a positive feedback loop. The oscillation parameters are then measured to adjust the components of the filter to achieve an oscillation that corresponds to a desired filter characteristic.

Figure 1A:
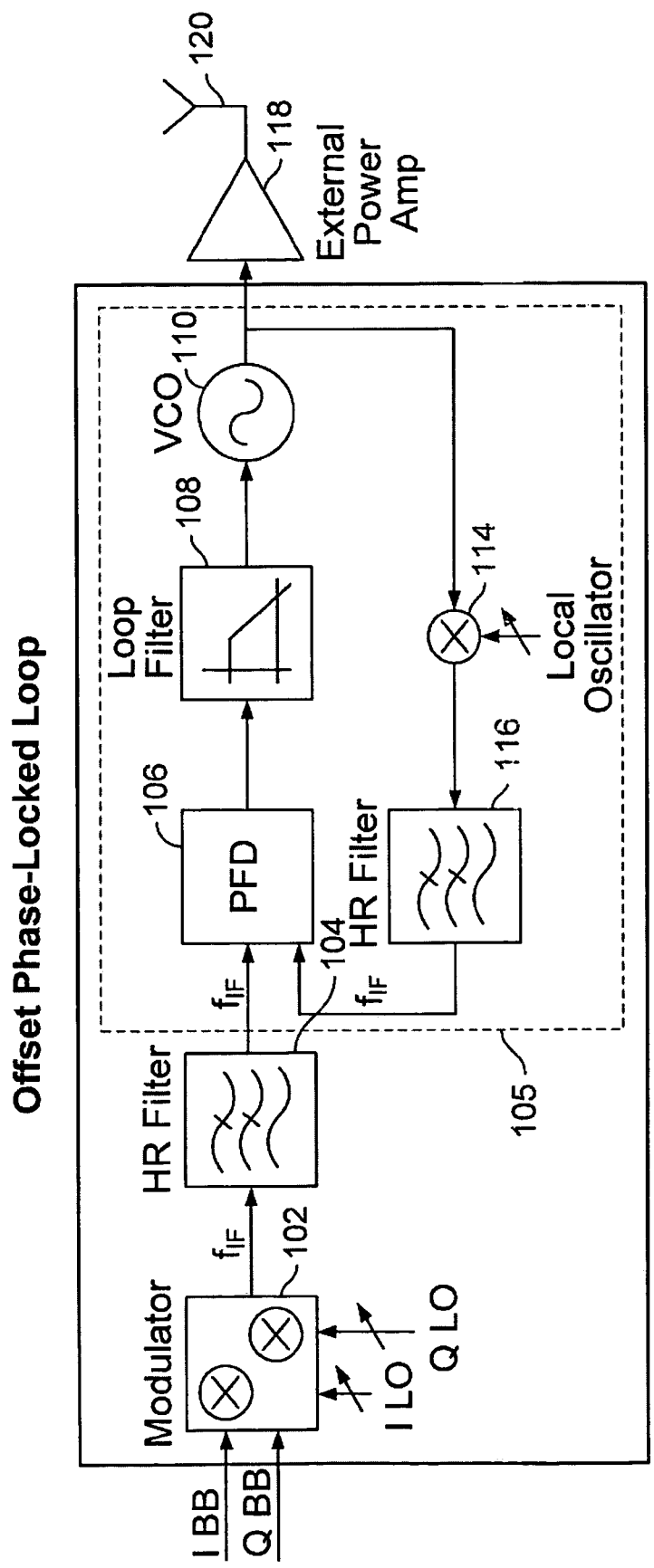
FIG. 1A is a diagram illustrating one embodiment of an offset phase-locked loop in a signal transmitter.

FIG. 1A is a diagram illustrating one embodiment of an offset phase-locked loop in a signal transmitter. In one embodiment, the signal transmitter is used in a cellular communication device. The signal transmitter can be used in a broader set of applications requiring a highly integrated transmitter. The modulator 102 mixes I and Q baseband signals using the corresponding signals from the I and Q local oscillators (LO). The modulated signals get filtered through the harmonic reject (HR) filter 104 to be passed on to a phase-locked loop (PLL) 105. The incoming signal is compared to a feedback signal in the phase frequency detector (PFD) 106. The output of the PFD is filtered by the loop filter 108 and fed into the voltage-controlled oscillator (VCO) 110. The feedback path from voltage-controlled oscillator 110 includes a mixer 114 that mixes the feedback signal with a signal from a local oscillator and an HR filter 116 to filter out unwanted harmonics from the signal. Power amp 118 amplifies the processed signal for transmission via the antenna 120. In some embodiments, the signal is amplified by a preamp before being amplified by power amp 118.

Figure 1B:
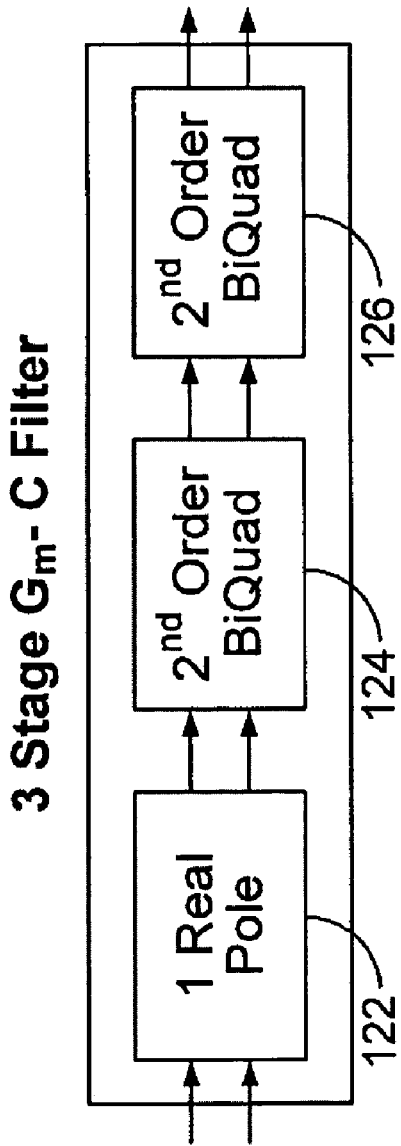
FIG. 1B is a diagram illustrating a typical three-stage filter including integrator stages composed with transconductance (Gm) and capacitor elements.

FIG. 1B is a diagram illustrating a typical three-stage filter including integrator stages composed with transconductance (Gm) and capacitor elements. The filter shown may be used as the HR filters 104 and 116 of FIG. 1A. Other embodiments can be configured to include any number of filter stages. In the example shown, various filter stages have been cascaded to obtain a steeper filter roll-off response. The first stage of the filter is a single pole filter 122. The other filters are two stages of second-order Biquad filters 124 and 126. Biquad filter stages have been chosen for their high Q value, constant bandwidth value, and decreased sensitivity to external component variations.

Figure 2:
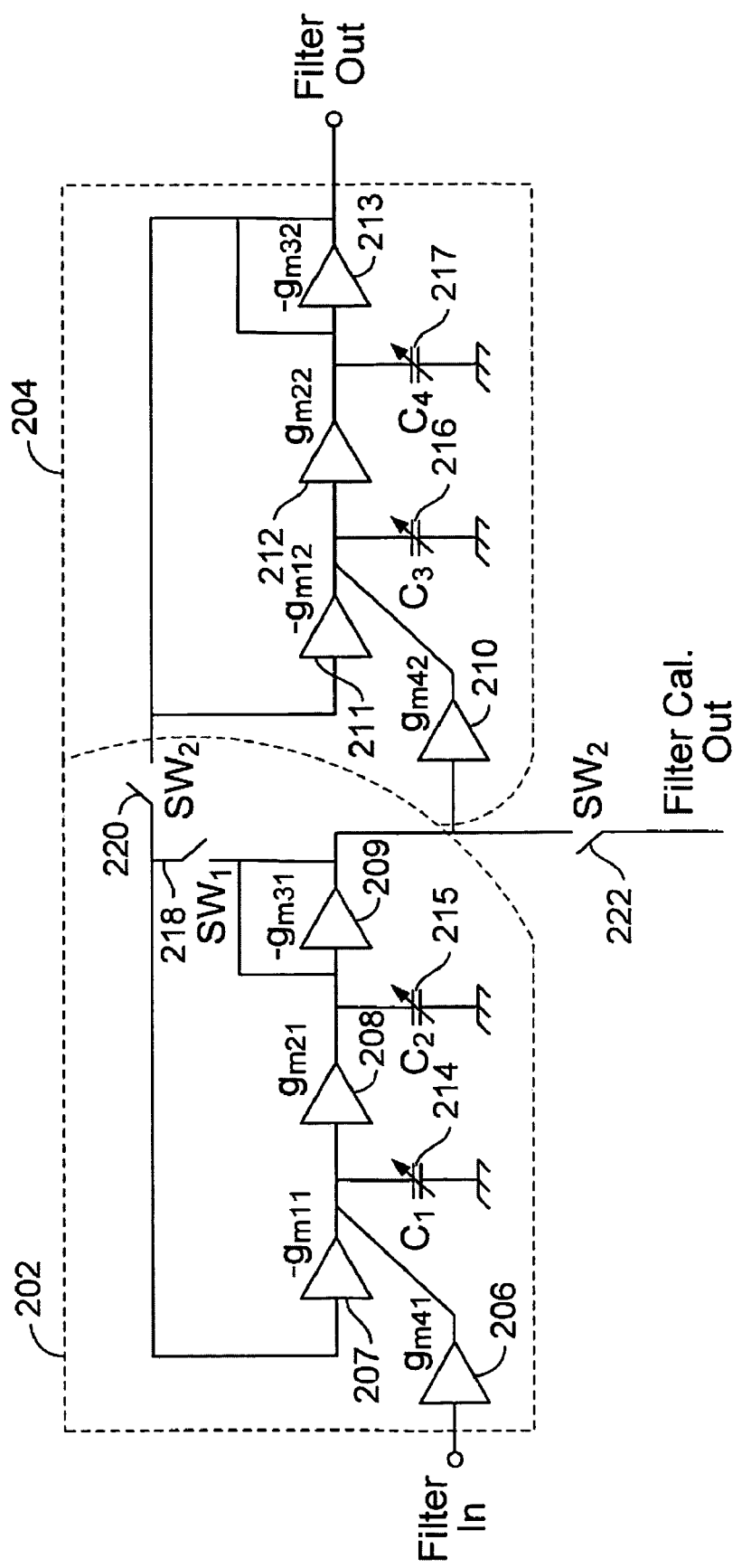
FIG. 2 is a diagram illustrating a filter that can be reconfigured as an oscillator for the purpose of calibrating the filter.

FIG. 2 is a diagram illustrating a filter that can be reconfigured as an oscillator for the purpose of calibrating the filter. The filter includes two second-order Biquad modules highlighted in boxes 202 and 204. Each Biquad module includes opamp/transconductance stage 206, opamp/transconductance stage 207, opamp/transconductance stage 208, opamp/transconductance stage 209, opamp/transconductance stage 210, opamp/transconductance stage 211, opamp/transconductance stage 212, opamp/transconductance stage 213, adjustable capacitor 214, adjustable capacitor 215, adjustable capacitor 216, adjustable capacitor 217, and may include other components including but not limited to resistors, capacitors, inductors, and power sources (not shown). The filter has two modes of operation: a filtering mode and a calibration/oscillation mode. In some embodiments, there may be more than two modes of operation. In the filtering mode, switch 218 is closed while switch 220 and switch 222 are open, placing each Biquad in a negative feedback configuration. In calibration mode, switch 218 is open while switch 220 and switch 222 are closed. The Biquads are connected together in a positive feedback configuration, causing the system to oscillate. In some embodiments, the criteria for filter oscillation is any third-order filter or higher (adding to a phase shift of more than 180 degrees) with an inversion in the positive feedback path. In some higher order embodiments, inversion is not required for oscillation.

In some embodiments, only a portion of the filter signal path is used for oscillation. Once oscillation is achieved, an oscillation property is measured. The oscillation property measurement is used to calibrate the filter. A frequency detector can be connected to the filter in oscillation mode by switch 222 and can measure the frequency of the oscillation. The frequency measurement is related to and in certain cases can be correlated with relevant characteristics of the filter such as the filter cutoff frequency. Once a relationship between the frequency measurement and a given filter characteristic is derived either analytically or empirically, the frequency measurement can be used to adjust the filter components to achieve an oscillation frequency that corresponds to a desired characteristic of the filter. In some embodiments, adjustable capacitor 214, adjustable capacitor 215, adjustable capacitor 216, and adjustable capacitor 217 are adjusted together to change the cutoff frequency (fc) of the filter. In some embodiments, the adjustable capacitors are adjusted individually to change the cutoff frequency (fc) of the filter.

Similarly, the transconductance of the filter may also be used to adjust the characteristics of the filter. A relationship between the transconductance and the frequency measurement is determined and then the oscillation frequency is adjusted to correspond to a desired transconductance.

Since an in situ measurement has been used to calibrate the filter, the oscillation signal generation may be inexpensively implemented in a filter using the switching arrangement described above without the need of external elements such as phase-locked loops to generate either calibration tones or used in a Master-Slave tuning algorithm. Moreover, the filter in oscillation mode will induce an oscillation within fractions of microsecond. The measurement may be made on the oscillation frequency without waiting for an external PLL to settle.

Figure 3:
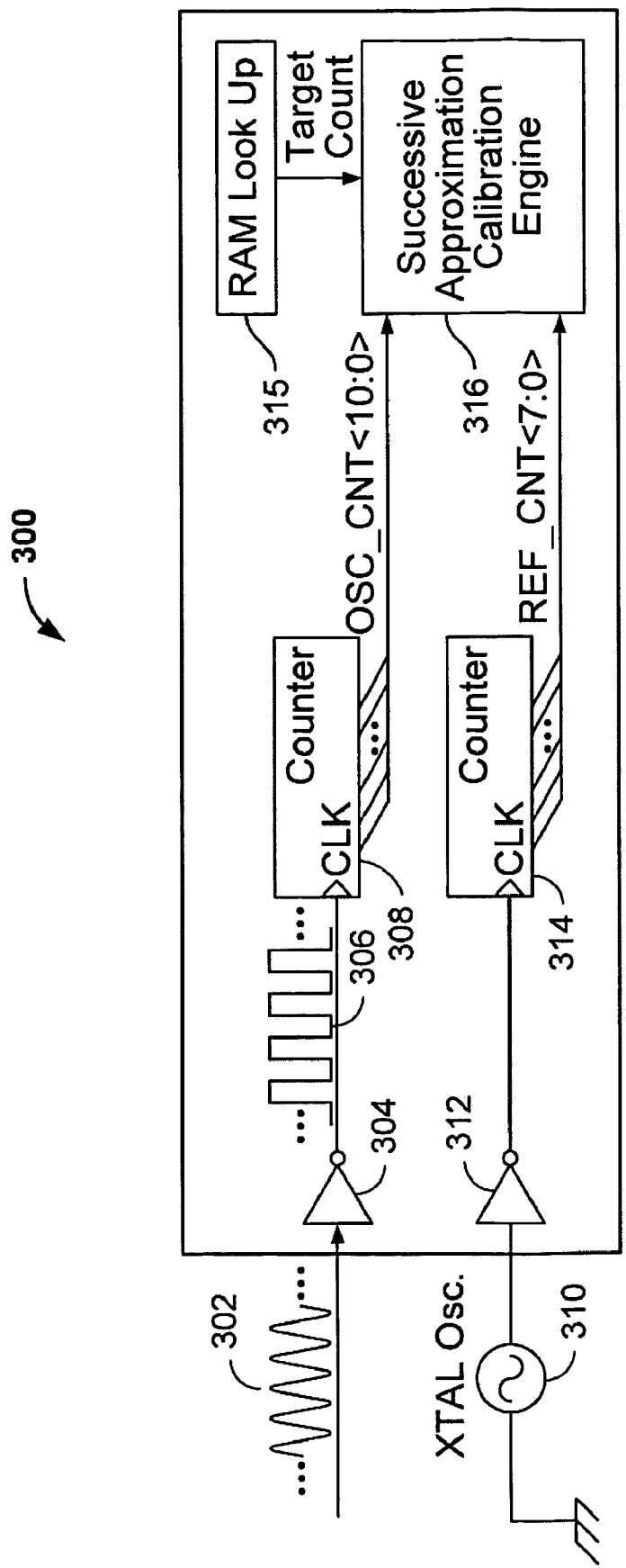
FIG. 3 is a diagram illustrating an oscillation frequency detector.

FIG. 3 is a diagram illustrating an oscillation frequency detector. Frequency detector 300 or any other appropriate frequency detector may be connected to a filter, such as the one depicted in FIG. 2. The incoming signal to be measured 302 is buffered through an inverter 304 to produce a square wave signal 306. Square wave signal 306 is fed into a counter 308. Counter 308 counts the number of edges in the square wave signal 306 within a prescribed time period to determine the count corresponding to the frequency of the signal. The time period may be preconfigured or dynamically configured. An oscillator 310 generates a reference frequency in the example shown. Similar to the incoming signal 302, this reference frequency signal is buffered by an inverter 312 to generate a reference count at counter 314. The ratio of the counts generated by counters 308 and 314 are used to compute an estimate of the filter oscillation frequency. The estimated oscillation frequency is compared to a target count found that may be stored in RAM lookup table 315. The target count in RAM lookup table 315 is associated with a desired count value for counter 308 which ultimately maps to the desired filter corner frequency during normal filter operation. The filter elements are adjusted based on the count associated with counter 308 and the target count associated with RAM lookup table 315. The oscillation frequency estimation and comparison may be performed a number of times using a successive approximation approach until the count value associated with a counter matches a value associated with data in RAM lookup table 315. In some embodiments, the oscillator is reconfigured to a filter for normal operation by opening switches 222 and 220 while closing switch 218 of FIG. 2.

Figure 4:
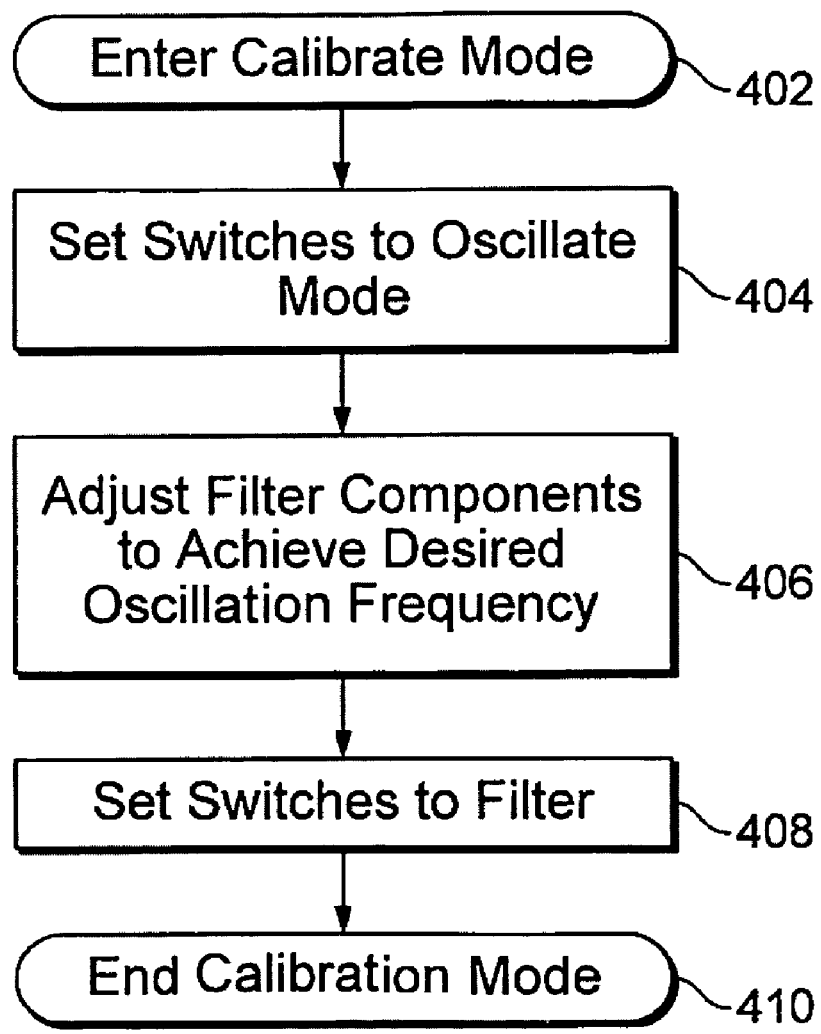
FIG. 4 is a flowchart of a process used to calibrate a filter.

FIG. 4 is a flowchart of a process used to calibrate a filter. Filter calibration mode is entered at 402. In some embodiments, the calibration process is invoked when the filter is powered on. In some embodiments, the calibration process is invoked before every instance of a related group of data. In some embodiments, the calibration process is invoked periodically. In some embodiments, the calibration process is invoked by another component. In some embodiments, the calibration process is invoked when the filter parameters are tuned. The filter is configured to oscillate at 404. The filter may be configured to oscillate by setting switches, relays, and/or any appropriate hardware or software component. After the reconfigured filter is oscillating, the filter components are adjusted at 406 to achieve an oscillation frequency corresponding to the desired characteristics of the filter. In various embodiments the filter components are adjusted to achieve the phase associated with the oscillation corresponding to the desired characteristics of the filter, or the current associated with the oscillation corresponding to the desired characteristics of the filter or the voltage associated with the oscillation corresponding to the desired characteristics of the filter, or any combination of the above. Other oscillation parameters may also be used to achieve desired filter characteristics. After the filter components have been adjusted, the switches are set back to filtering mode at 408, consequently ending the calibration mode at 410.

Figure 5:
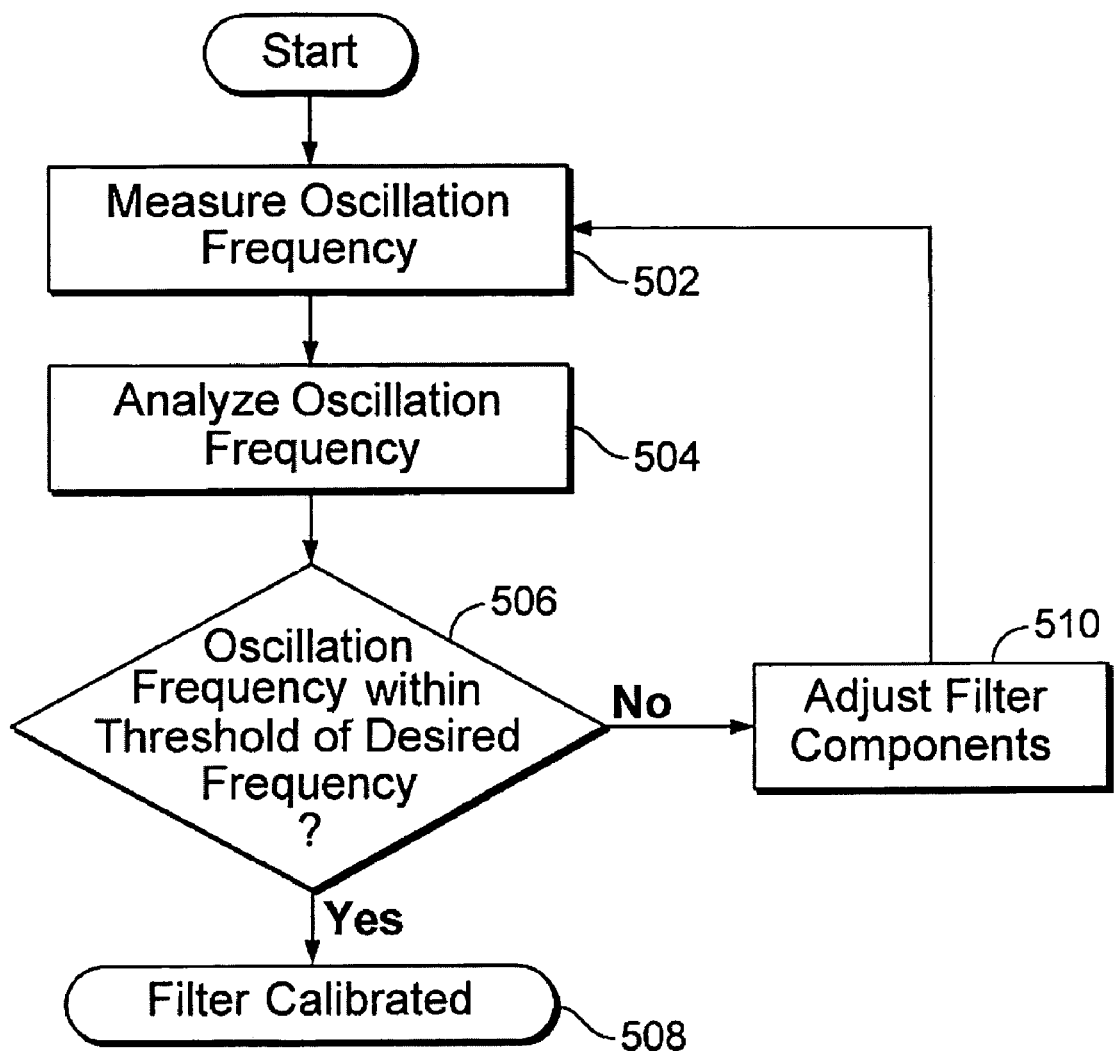
FIG. 5 is a flowchart of a process for adjusting filter components to achieve a desired oscillation frequency.

FIG. 5 is a flowchart of a process for adjusting filter components to achieve a desired oscillation frequency. In some embodiments, the process of FIG. 5 is used to implement 406 of FIG. 4. The oscillation frequency of the filter is measured at 502. The oscillation frequency is analyzed at 504. Oscillation frequency analysis may include using counters to measure oscillation frequency as described above. In some embodiments, oscillation frequency analysis includes comparing the oscillation frequency to a reference frequency. If the oscillation frequency is determined at 506 to be within the range of frequencies corresponding to the desired filter characteristics, a "filter calibrated" conclusion is reached at 508. The threshold may be configurable. In some embodiments, the threshold is configured by another device. If the oscillation frequency is not within the desired range, the filter components are adjusted at 510 to achieve the desired frequency. In some embodiments, a successive approximation method is used to adjust filter components to achieve the desired oscillation frequency. In some embodiments, a formula based on current filter characteristics is used to match filter component adjustment with the desired oscillation frequency. One such formula is $$\omega_{OSC} \cong \sqrt{\frac{g_{m22} \cdot g_{m12} \cdot g_{m31}}{\frac{C_2}{C_4}(g_{m32} + g_{m31}) \cdot C_3 \cdot C_4}}$$

where $\omega_{OSC}$ is the oscillation frequency, $g_m$ are transconductance values, and C are capacitance values of the filter shown in FIG. 2. In some embodiments, the formula above assumes the loop gain is linear and the ratio between the filter corner frequency and the oscillation frequency is constant. Other search methods may also be used to determine filter components that achieve an oscillation frequency that corresponds to a desired filter characteristic.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method of calibrating a filter having filter components, including:
   reconfiguring the filter including at least two stages from a filtering mode to a calibration mode including an oscillation property, wherein each of the at least two stages being included for both the filtering mode and the calibration mode and wherein one of the at least two stages is reconfigurable between both the filtering mode and the calibration mode; and
   adjusting the filter component so that the oscillation property corresponds to a desired filter characteristic.

2. A method as recited in claim 1, wherein reconfiguring the filter comprises altering a negative feedback loop in order to create a positive feedback loop in the filter.

3. A method as recited in claim 1, wherein reconfiguring the filter comprises setting a switch.

4. A method as recited in claim 1, wherein the oscillation property comprises an oscillation frequency.

5. A method as recited in claim 1, wherein the oscillation property comprises an oscillation phase.

6. A method as recited in claim 1, wherein the filter characteristic comprises a cutoff frequency.

7. A method as recited in claim 1, wherein the filter characteristic comprises a signal phase.

8. A method as recited in claim 1, wherein adjusting the filter component comprises adjusting a capacitance value.

9. A method as recited in claim 1, wherein adjusting the filter component comprises adjusting an inductance value.

10. A method as recited in claim 1, wherein adjusting the filter component comprises adjusting a resistance value.

11. A method as recited in claim 1, wherein adjusting the filter component comprises adjusting a transconductance value.

12. A method as recited in claim 1, further comprising adjusting a plurality of adjustable filter components.

13. A method as recited in claim 1, further comprising taking an in situ measurement of the filter.

14. A method as recited in claim 1, further comprising measuring the oscillation frequency.

15. A method as recited in claim 14, further comprising comparing the measured oscillation frequency to a reference signal frequency.

16. A method as recited in claim 1, wherein adjusting a filter component comprises using a successive approximation approach.

17. A method as recited in claim 1, wherein adjusting the filter component comprises using a formula encompassing the current filter characteristic.

18. A method as recited in claim 1, wherein adjusting the filter component comprises using a formula encompassing the oscillation property.

19. A method as recited in claim 1, wherein the filter has multiple functional modes of operation.

20. A method as recited in claim 19, wherein the functional modes of operation comprise a filtering mode and a calibration mode.

21. A method as recited in claim 1, wherein calibration is performed when the filter is powered on.

22. A method as recited in claim 1, wherein filter calibration is performed before each instance of a related group of data.

23. A method as recited in claim 1, wherein filter calibration is performed when invoked by a component external to the filter.

24. A method as recited in claim 1, wherein filter calibration is performed when the filter component is tuned.

25. A method as recited in claim 1, wherein filter calibration is performed multiple times on a prescribed periodic basis.

26. A method as recited in claim 1, wherein the filter is in a Biquad configuration.

27. A method as recited in claim 1, wherein the filter component is adjusted to achieve an oscillation property within a prescribed threshold.

28. A method as recited in claim 1, wherein the filter comprises a single input that is used during both the filtering mode and the calibration mode.

29. A system for calibrating a filter, including:
   a filter component; and
   a reconfiguration component configured to reconfigure the filter including at least two stages from a filtering mode to a calibration mode including an oscillation property, wherein each of the at least two stages being included for both the filtering mode and the calibration mode and wherein one of the at least two stages is reconfigurable between both the filtering mode and the calibration mode;
   wherein the filter component is configured to be adjustable so that the oscillation property corresponds to a desired filter characteristic.

30. A system as recited in claim 29, wherein the reconfiguration component is configured to alter a negative feedback loop in order to create a positive feedback loop in the filter.

31. A system as recited in claim 29, wherein the reconfiguration component includes a switch.

32. A system as recited in claim 29, wherein the oscillation property includes an oscillation frequency.

33. A system as recited in claim 29, wherein the oscillation property includes an oscillation phase.

34. A system as recited in claim 29, wherein the filter characteristic includes a cutoff frequency.

35. A system as recited in claim 29, wherein the filter characteristic includes a signal phase.

36. A system as recited in claim 29, wherein the filter component is configured to be adjustable by adjusting a capacitance value.

37. A system as recited in claim 29, wherein the filter component is configured to be adjustable by adjusting an inductance value.

38. A system as recited in claim 29, wherein the filter component is configured to be adjustable by adjusting a resistance value.

39. A system as recited in claim 29, wherein the filter component is configured to be adjustable by adjusting a transconductance value.

40. A system as recited in claim 29, wherein the filter component is configured to be adjustable by adjusting a plurality of adjustable filter components.

41. A system as recited in claim 29, wherein the filter component is configured to take an in situ measurement of the filter.

42. A system as recited in claim 29, wherein the filter component is configured to measure the oscillation frequency.

43. A system as recited in claim 29, wherein the filter has multiple functional modes of operation.

44. A system as recited in claim 43, wherein the functional modes of operation include a filtering mode and a calibration mode.

45. A system as recited in claim 29, wherein filter calibration is performed when the filter is powered on.

46. A system as recited in claim 29, wherein the system is configured so that filter calibration is performed before every instance of a related group of data.

47. A system as recited in claim 29, wherein the system is configured so that filter calibration is performed when invoked by a component external to the filter.

48. A system as recited in claim 29, wherein the system is configured so that filter calibration is performed when the filter component is tuned.

49. A system as recited in claim 29, wherein the system is configured so that filter calibration is performed multiple times on a prescribed periodic basis.

50. A system as recited in claim 29, wherein the filter is in a Biquad configuration.

51. A system as recited in claim 29, wherein the filter components are configured to be adjustable to achieve an oscillation property within a prescribed threshold.

52. A apparatus for calibrating a filter having filter components, including:

means for reconfiguring the filter including at least two stages from a filtering mode to a calibration mode including an oscillation property, wherein each of the at least two stages being included for both the filtering mode and the calibration mode and wherein one of the at least two stages is reconfigurable between both the filtering mode and the calibration mode; and means for adjusting the filter component so that the oscillation property corresponds to a desired filter characteristic.

53. The apparatus as recited in claim 52, wherein the means for reconfiguring the filter comprises altering a negative feedback loop in order to create a positive feedback loop in the filter.

54. The apparatus as recited in claim 52, wherein the means for reconfiguring the filter comprises setting a switch.

55. The apparatus as recited in claim 52, wherein the means for adjusting the filter component comprises adjusting a capacitance value.

56. The apparatus as recited in claim 52, wherein the means for adjusting the filter component comprises adjusting an inductance value.

57. The apparatus as recited in claim 52, wherein adjusting the filter component comprises adjusting a resistance value.

58. The apparatus as recited in claim 52, wherein adjusting the filter component comprises adjusting a transconductance value.

59. The apparatus as recited in claim 52 further comprising:
means for taking an in situ measurement of the filter.

60. The apparatus as recited in claim 52 further comprising:
means for measuring the oscillation frequency.

61. The apparatus as recited in claim 60, further comprising:
means for comparing the measured oscillation frequency to a reference signal frequency.

\* \* \* \* \*